(12) United States Patent
Yoo

(10) Patent No.: US 9,828,241 B2
(45) Date of Patent: Nov. 28, 2017

(54) MANUFACTURING METHOD OF MICRO-ELECTRO-MECHANICAL SYSTEM SENSOR CAPABLE OF PREVENTING DIFFUSION PHENOMENON AND REFLOW PHENOMENON

(71) Applicant: HYUNDAI MOTOR COMPANY, Seoul (KR)

(72) Inventor: Ilseon Yoo, Suwon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/197,418

(22) Filed: Jun. 29, 2016

(65) Prior Publication Data

US 2017/0166443 A1 Jun. 15, 2017

(30) Foreign Application Priority Data

Dec. 11, 2015 (KR) .......................... 10-2015-0177471

(51) Int. Cl.
  *H01L 21/00* (2006.01)
  *B81C 1/00* (2006.01)
  *B81B 7/00* (2006.01)

(52) U.S. Cl.
  CPC .......... *B81C 1/00269* (2013.01); *B81B 7/007* (2013.01); *B81B 2201/0235* (2013.01); *B81B 2201/0242* (2013.01); *B81B 2203/04* (2013.01); *B81C 2201/013* (2013.01); *B81C 2201/0159* (2013.01); *B81C 2203/0118* (2013.01);

(Continued)

(58) Field of Classification Search
  CPC .......... B81C 1/00269; B81B 2201/013; B81C 2201/0159; B81C 2203/031; B81C 2203/036
  USPC ........................................... 438/58
  See application file for complete search history.

(56) References Cited

U.S. PATENT DOCUMENTS 5,616,844 A * 4/1997 Suzuki .................... G01P 1/023
                                            73/493
6,872,902 B2 * 3/2005 Cohn ...................... B81B 7/0077
                                            200/181

(Continued)

FOREIGN PATENT DOCUMENTS

JP          4495711 B2      7/2010
KR     10-0447851 B1       9/2004

(Continued)

*Primary Examiner* — Caleb Henry
(74) *Attorney, Agent, or Firm* — McDermott Will & Emery LLP

(57) ABSTRACT

A manufacturing method of a MEMS sensor includes forming a first substrate, wherein the first substrate includes a lower electrode provided at one surface thereof, forming a second substrate, wherein the second substrate includes a first concave-convex portion provided at one surface thereof, first-bonding one surface of the first substrate and one surface of the second substrate to face each other, forming a third substrate, wherein the third substrate includes an upper electrode provided at one surface thereof, second-bonding another surface of the second substrate and one surface of the third substrate to face each other, and forming an electrode line on another surface of the third substrate to be connected to the lower electrode and the upper electrode.

13 Claims, 7 Drawing Sheets

(52) U.S. Cl.
CPC .. *B81C 2203/031* (2013.01); *B81C 2203/035* (2013.01); *B81C 2203/036* (2013.01)

(56) References Cited

U.S. PATENT DOCUMENTS

| | | | | |
|---|---|---|---|---|
| 6,925,875 | B2* | 8/2005 | Silverbrook | B81C 1/00269 257/E23.128 |
| 7,195,393 | B2* | 3/2007 | Potter | F04B 43/043 251/129.01 |
| 7,280,014 | B2* | 10/2007 | Potter | H01H 59/0009 200/181 |
| 7,833,879 | B2* | 11/2010 | Chen | G02B 26/0841 257/E21.657 |
| 8,790,946 | B2 | 7/2014 | Huang et al. | |
| 8,887,382 | B2* | 11/2014 | Wenk | B81C 1/00269 29/831 |
| 9,481,572 | B2* | 11/2016 | Jacobs | B81C 1/00595 |
| 2002/0000649 | A1 | 1/2002 | Tilmans | B81B 7/0077 257/678 |
| 2003/0079548 | A1* | 5/2003 | Potter | B81C 1/00158 73/753 |
| 2003/0081397 | A1* | 5/2003 | Potter | H02N 1/08 361/807 |
| 2003/0112096 | A1* | 6/2003 | Potter | H03H 3/0072 333/186 |
| 2003/0201784 | A1* | 10/2003 | Potter | H03H 3/0072 324/663 |
| 2004/0023236 | A1* | 2/2004 | Potter | G01N 29/036 435/6.12 |
| 2005/0035683 | A1* | 2/2005 | Raisanen | H04R 19/016 310/311 |
| 2006/0281227 | A1* | 12/2006 | Yang | B81B 7/0067 438/118 |
| 2007/0251324 | A1* | 11/2007 | Wado | B06B 1/0688 73/649 |
| 2009/0001553 | A1* | 1/2009 | Pahl | B81B 7/0064 257/704 |
| 2012/0307333 | A1* | 12/2012 | Kimura | G02B 26/0841 359/230 |
| 2014/0190252 | A1* | 7/2014 | Huang | G01F 1/69 73/204.25 |

FOREIGN PATENT DOCUMENTS

| | | |
|---|---|---|
| KR | 10-2006-0105246 A | 10/2006 |
| KR | 10-2012-0054126 A | 5/2012 |
| KR | 10-1459977 B1 | 11/2014 |

* cited by examiner

MANUFACTURING METHOD OF MICRO-ELECTRO-MECHANICAL SYSTEM SENSOR CAPABLE OF PREVENTING DIFFUSION PHENOMENON AND REFLOW PHENOMENON

CROSS-REFERENCE TO RELATED APPLICATION

This application claims the benefit of priority to Korean Patent Application No. 10-2015-0177471, filed with the Korean Intellectual Property Office on Dec. 11, 2015, the entire contents of which is incorporated herein by reference.

TECHNICAL FIELD

The present disclosure relates to a manufacturing method of a micro-electro-mechanical system (MEMS) sensor. More particularly, the present disclosure relates to a manufacturing method of a MEMS sensor that may apply an upper electrode made of polysilicon to the MEMS sensor such that a diffusion phenomenon and a reflow phenomenon may be prevented from occurring while the MEMS sensor is packaged.

BACKGROUND

Micro-electro-mechanical system (MEMS) sensors are widely applied to vehicles, inertial guidance systems, home electrical appliances, protection systems for various apparatuses, and various industrial, scientific, and engineering systems.

Such a MEMS sensor senses a physical condition such as acceleration, pressure, temperature, etc., and provides an electrical signal corresponding to the sensed physical condition.

Many high performance MEMS sensors are packaged as a closed or sealed type in a vacuum or gaseous environment.

According to various MEMS sensor technologies, a sensing substrate wafer may be processed by a dicing process, and then a MEMS sensor substrate may be packaged and sealed as a closed type in a package level.

The method of packaging and sealing the MEMS sensor may include silicon to glass anodic bonding that uses various intermediate bonding agents, and a package level sealing (PLS) process including wafer-to-wafer bonding.

However, the package level sealing process may cause problems such as static friction between the sensing wafer and substrate components during the bonding process, or a low yield of the MEMS sensors.

In order to solve these problems and to reduce undesirable characteristics associated with the PLS, simple and rapid wafer level packaging (WLP) technologies are desirable.

The above information disclosed in this Background section is only to enhance the understanding of the background of the disclosure and therefore it may contain information that does not form the prior art that is already known.

SUMMARY

The present disclosure has been made in an effort to provide a manufacturing method of a MEMS sensor that may apply an upper electrode made of polysilicon to the MEMS sensor and may bond three sheets of wafers through a double bonding process including anodic-bonding and eutectic-bonding such that a diffusion phenomenon and a reflow phenomenon may be prevented from occurring during the bonding process.

An exemplary embodiment of the present disclosure provides a manufacturing method of an MEMS sensor, including: forming a first substrate, wherein the first substrate includes a lower electrode provided at one surface thereof; forming a second substrate, wherein the second substrate includes a first concave-convex portion provided at one surface thereof; first-bonding one surface of the first substrate and one surface of the second substrate to face each other; forming a third substrate, wherein the third substrate includes an upper electrode provided at one surface thereof; second-bonding another surface of the second substrate and one surface of the third substrate to face each other; and forming an electrode line on another surface of the third substrate to be connected to the lower electrode and the upper electrode.

The upper electrode may be made of polysilicon and may be formed by ion-injecting.

The first-bonding step may include anodic bonding, and the second-bonding step may include eutectic bonding.

The step of forming the first substrate may include: preparing the first substrate; forming a photoresist on the one surface of the first substrate, and then patterning the photoresist; forming a lower electrode layer on the first substrate and an upper portion of the photoresist; and forming the lower electrode by removing the patterned photoresist.

The first substrate may be a glass substrate.

The step of forming of the second substrate may include: preparing the second substrate; forming a photoresist on the one surface of the second substrate, and then patterning the photoresist; forming a plurality of depressions and a plurality of protrusions by using the patterned photoresist as a mask; and forming a low protrusion by step-etching at least one of the plurality of protrusions.

The low protrusion may be bonded to one side of the lower electrode of the first substrate.

The manufacturing method of the MEMS sensor may further include: after the first-bonding step, forming a photoresist on the other surface of the second substrate, and then pattering the photoresist; forming a second concave-convex portion including a plurality of depressions and a plurality of protrusions by using the patterned photoresist as a mask; and forming a sensing portion at a center of the other surface of the second substrate.

The step of forming of the sensing portion may include: forming a metal layer and a photoresist on the other surface of the second substrate, and then patterning the metal layer and the photoresist; and forming the sensing portion by etching the second substrate while using the patterned metal layer and the patterned photoresist as a mask.

The metal layer may be made of at least one of aluminum (Al), copper (Cu), and an alloy thereof.

The step of forming of the third substrate may include: preparing the third substrate; forming a photoresist on one surface of the third substrate, and then patterning the photoresist; forming a connecting hole by using the patterned photoresist as a mask; forming an insulating layer on the one surface and another surface of the third substrate, respectively; forming a connecting electrode inside the connecting hole; forming an upper electrode on the one surface of the third substrate to contact the connecting electrode; and forming a bonding layer on the upper electrode by using a metal material.

The connecting electrode may be made of at least one of copper (Cu) and an alloy thereof.

In the second-bonding step, the third substrate may be bonded to the other surface of the second substrate through the bonding layer of the third substrate.

The step of forming of the electrode line may include: forming an electrode line layer on the other surface of the third substrate by using a metal material; forming a photoresist on the electrode line layer, and then patterning the photoresist; and forming the electrode line to contact the connecting electrode formed in the third substrate by etching the electrode line layer while using the patterned photoresist as a mask.

According to exemplary embodiments of the present disclosure, a diffusion phenomenon and a reflow phenomenon occurring during the bonding process may be prevented by applying the upper electrode made of polysilicon to the MEMS sensor, and by bonding the first substrate formed as a glass substrate and the second substrate formed as the silicon substrate through the anodic bonding, and then by bonding the second substrate and the third substrate formed as the silicon substrate through the eutectic bonding.

Further, effects that may be obtained or expected from exemplary embodiments of the present disclosure are directly or suggestively described in the following detailed description. That is, various effects expected from exemplary embodiments of the present disclosure will be described in the following detailed description.

DETAILED DESCRIPTION

Hereinafter, exemplary embodiments of the present disclosure will be described with reference to the accompanying drawings. However, the drawings described below and the following detailed description relate to one exemplary embodiment of various exemplary embodiments for effectively explaining the characteristics of the present disclosure. Therefore, the present disclosure should not be construed as being limited to the drawings and the following description.

FIGS. 1 to 7 illustrate sequential processing diagrams of a manufacturing method of a MEMS sensor according to an exemplary embodiment of the present disclosure.

Figure 1:
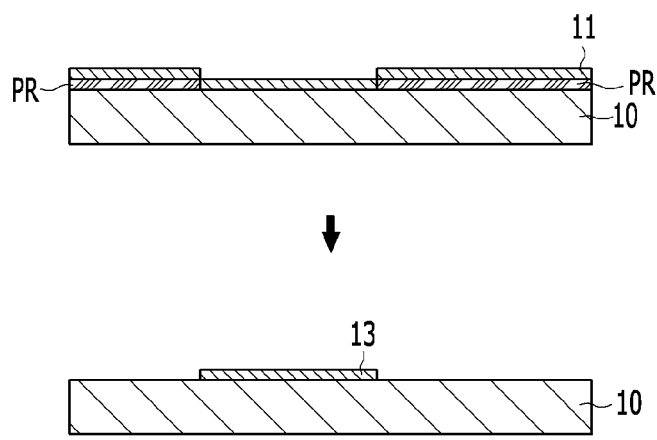
FIGS. 1 to 7 illustrate sequential processing diagrams of a manufacturing method of a MEMS sensor according to an exemplary embodiment of the present disclosure.

Referring to FIG. 1, a step of forming a first substrate 10 including a lower electrode provided at one surface thereof may be performed.

In other words, the first substrate forming step may prepare the first substrate 10.

The first substrate 10 may be a glass substrate made of a glass material. Subsequently, a photoresist (PR) may be formed on one surface of the first substrate 10, and then the photoresist (PR) may be patterned.

The photoresist (PR) may be a material that is chemically changed when light is irradiated thereto, or onto the PR, and when a PR material is coated on an upper portion of the substrate 10 and then is developed by an exposure apparatus, a PR material of a portion on which light is irradiated may remain.

A material formed on an upper portion of the photoresist (PR) may be removed by the development described above, or a material formed on a lower portion of the photoresist (PR) may be protected and the remaining portion may be etched by using the photoresist (PR) as a mask.

Subsequently, a lower electrode layer 11 may be formed on the first substrate 10 and the photoresist (PR).

Then, the patterned photoresist (PR) may be removed to form a lower electrode 13.

In this case, some of the lower electrode layer 11 disposed on the patterned photoresist (PR) may be removed together therewith, and thus only the lower electrode 13 may remain.

Figure 2:
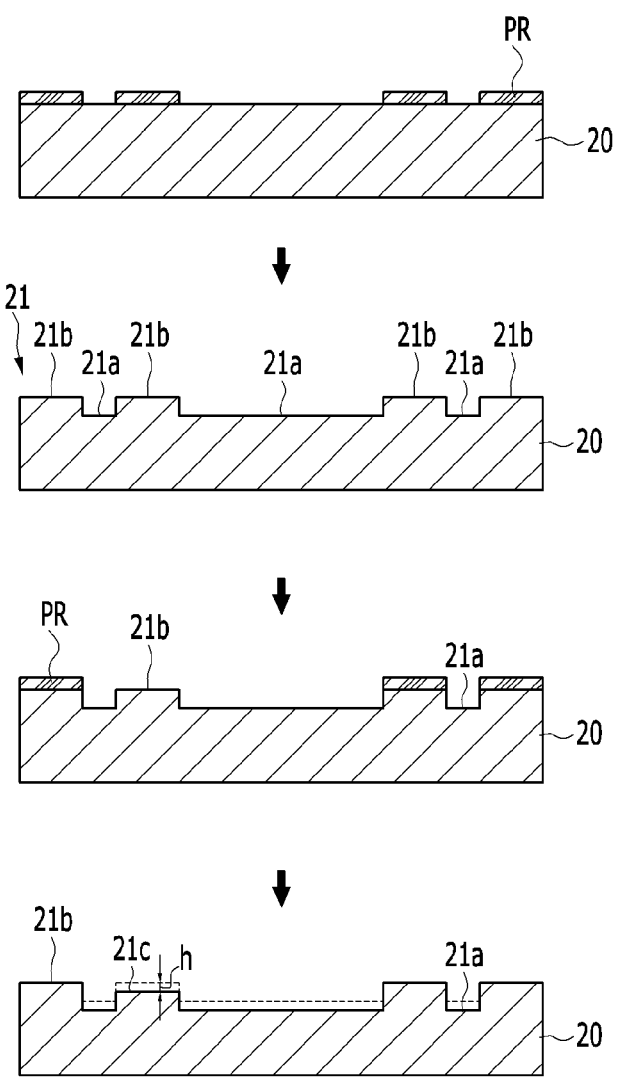

Referring to FIG. 2, a step of forming a second substrate 20 including a first concave-convex portion 21 provided at one surface thereof may be performed.

In other words, the second substrate forming step may prepare the second substrate 20.

The second substrate 20 may be a silicon substrate made of a silicon material.

Subsequently, a photoresist (PR) may be formed on one surface of the second substrate 20, and then the photoresist (PR) may be patterned.

The first concave-convex portion 21 may be formed by using the patterned photoresist (PR) as a mask.

The first concave-convex portion 21 may include a plurality of depressions 21a and a plurality of protrusions 21b.

A low protrusion 21c, or a low protrusion relative to the plurality of protrusions 21b, may be formed in at least one of the plurality of protrusions 21b by step-etching.

That is, in the method of forming the low protrusion 21c, a photoresist (PR) may be formed on only the remaining protrusions 21b excluding at least one protrusion 21b for forming the low protrusion 21c.

Subsequently, the second substrate 20 may be etched by using the photoresist (PR) as a mask.

In this case, a height of the second substrate 20 on which the photoresist (PR) is not formed may be lowered.

That is, a portion of the second substrate 20 on which the photoresist (PR) is not formed may be etched by a height "h," and depths of the plurality of depressions 21 may be further deepened.

Accordingly, the low protrusion 21c with a relatively low height may be formed.

The number of low protrusions 21c may be one or more, but is not limited thereto.

Figure 3:
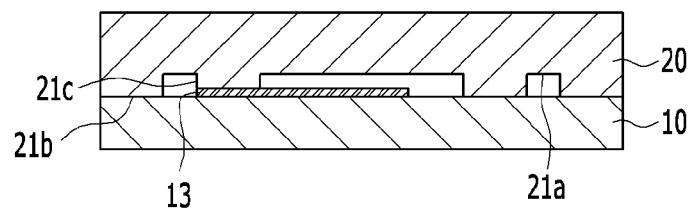

Referring to FIG. 3, a step of first bonding at which one surface of the first substrate 10 and one surface of the second substrate 20 are bonded to face each other may be performed.

In this case, the low protrusion 21c of the second substrate 20 may be bonded to one side of the lower electrode 13 of the first substrate 10.

The step of first bonding may include anodic bonding.

Anodic bonding is a technology for bonding a glass substrate having a similar thermal expansion coefficient to that of a silicon substrate.

Since a predetermined amount of sodium (Na), potassium (K), etc. may be contained in the glass substrate typically used for the anodic bonding, when the glass substrate is heated by heat of equal to or greater than about 200° C., its elements may be charged to easily move according to a predetermined voltage.

Subsequently, when a voltage of about 600 V or more is applied to the silicon substrate and the glass substrate, mobility charges may rapidly move and a charge phenomenon may occur at an interface between the silicon substrate and the glass substrate, thus the silicon substrate and the glass substrate may be bonded.

Figure 4:
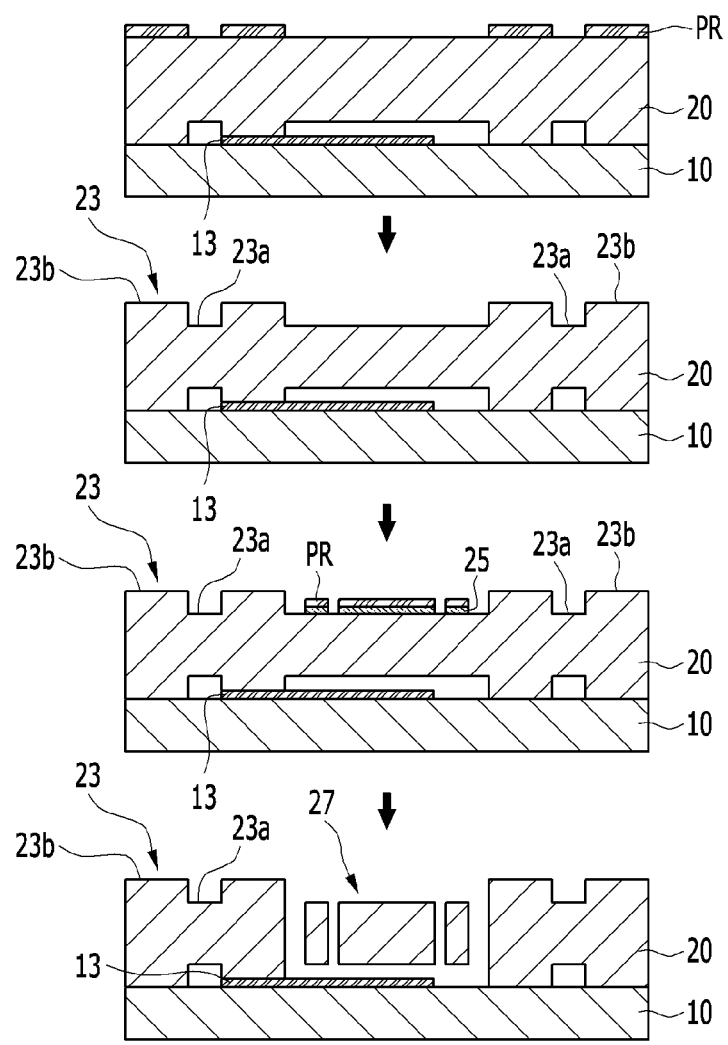

Referring to FIG. 4, after the step of first bonding, a sensing portion 27 may be formed on the second substrate 20.

In other words, a photoresist (PR) may be formed on another surface of the second substrate 20, and then the photoresist (PR) may be patterned.

Subsequently, a second concave-convex portion 23 may be formed by using the patterned photoresist (PR) as a mask.

The second concave-convex portion 23 may consist of a plurality of depressions 23a and a plurality of protrusions 23b, similar to the first concave-convex portion 21.

Next, a metal layer 25 and a photoresist (PR) may be sequentially formed on the other, or another, surface of the second substrate 20, and then the metal layer 25 and the photoresist (PR) may be patterned.

In this case, the metal layer 25 may be made of at least one of aluminum (Al), copper (Cu), and an alloy thereof.

The patterned metal layer 25 and the patterned photoresist (PR) may remain in a predetermined pattern at a center portion of the other surface of the second substrate 20.

Subsequently, the sensing portion 27 may be formed by etching the second substrate 20 while using the patterned metal layer 25 and photoresist (PR) as a mask.

The sensing portion 27 may be vibrated by external impact, vibration, angular velocity, acceleration, etc.

Accordingly, due to the vibration, respective distances between the sensing portion 27 and the lower electrode 13 and an upper electrode 33 described later may be changed, and thus a capacitance therebetween may be changed.

Figure 5:
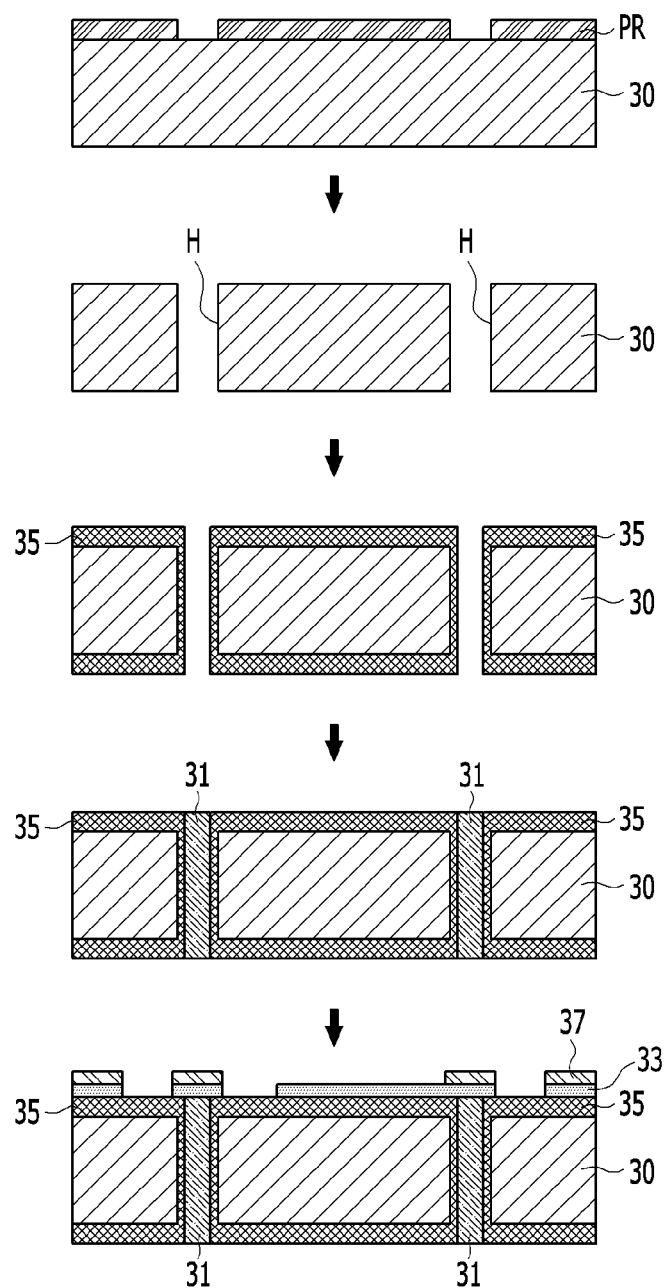

Referring to FIG. 5, a step of forming a third substrate 30 in which the third substrate 30 including the upper electrode 33 provided at one surface thereof is formed, may be performed.

In other words, the third substrate forming step may form the third substrate 30.

The third substrate 30 may be a silicon substrate made of a silicon material.

Subsequently, a photoresist (PR) may be formed on one surface of the third substrate 30, and then the photoresist (PR) may be patterned.

A connecting hole (H) may be formed by using the patterned photoresist (PR) as a mask.

Next, the one surface and another surface of the third substrate 30 and an inner surface of the connecting hole (H) may be respectively provided with insulating layers 35.

Subsequently, a connecting electrode 31 may be formed in an inner portion of the connecting hole (H).

In this case, the connecting electrode 31 may be made of at least one of copper (Cu) and an alloy thereof.

The upper electrode 33 may be formed at the one surface of the third substrate 30 to be connected to the connecting electrode 31.

In this case, the upper electrode 33 may be made of polysilicon, and may be formed by ion-injecting.

Next, a bonding layer 37 may be formed on the upper electrode 33 by using a metal material.

Figure 6:
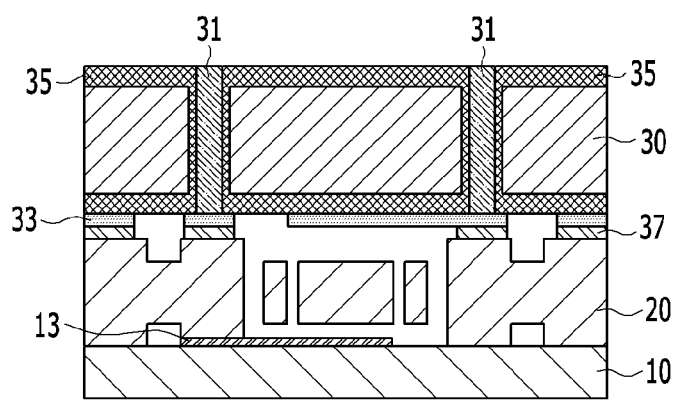

Referring to FIG. 6, a step of second bonding at which the other surface of the second substrate 20 and the one surface of the third substrate 30 are bonded to face each other may be performed.

According to the step of second bonding, the other surface the second substrate 20 may be bonded to the third substrate 30 through the bonding layer 37 of the third substrate 30.

The step of second bonding may include eutectic bonding.

Eutectic bonding means that the components of the substrates, for example, the surfaces thereof, are easily melted and bonded to each other at the lowest melting point when conditions of temperature, pressure, and time are satisfied.

Figure 7:
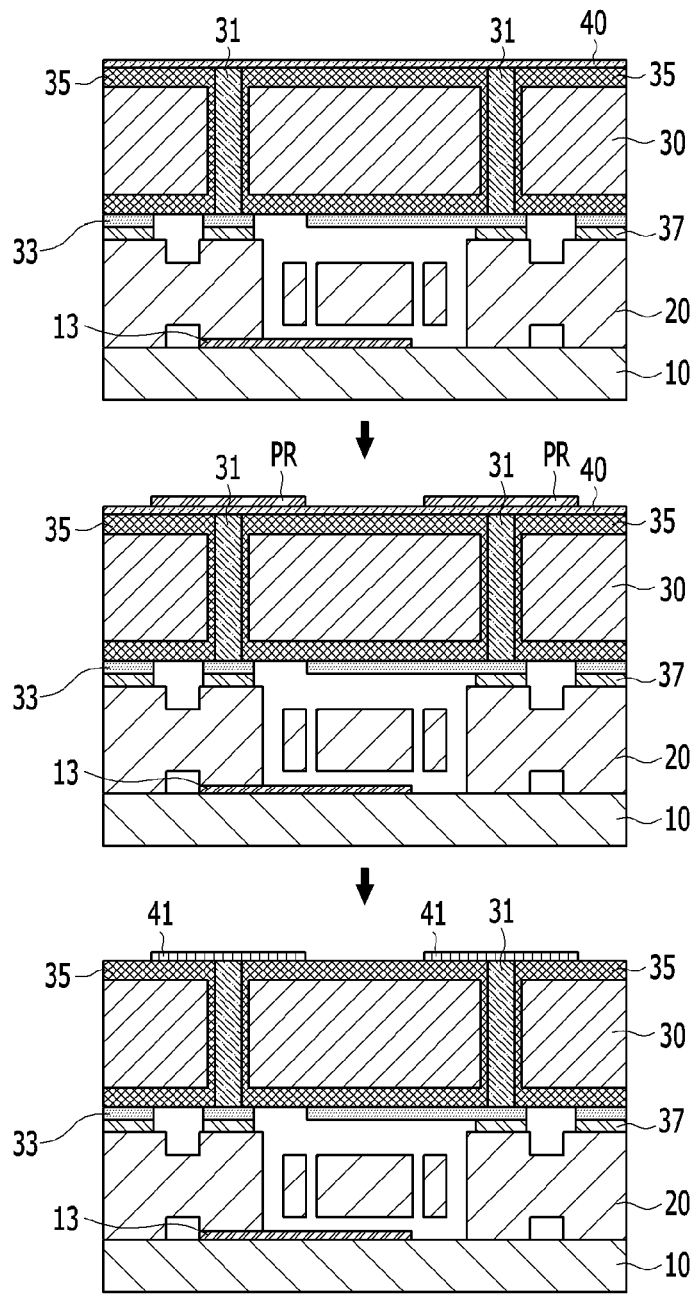

Referring to FIG. 7, a step of forming an electrode line 41 on another surface of the third substrate 30 may be performed.

That is, an electrode line layer 40 may be formed on the other surface of the third substrate 30 by using a metal material.

Subsequently, a photoresist (PR) may be formed on an upper portion of the electrode line layer 40, and then the photoresist (PR) may be patterned.

The electrode line 41 may be formed by etching the electrode line layer 40 while using the patterned photoresist (PR) as a mask.

In this case, the electrode line 41 may be formed to contact the connecting electrode 31.

The sensing portion 27 of an MEMS sensor formed by the manufacturing method described above may be vibrated by external impact, vibration, angular speed, and acceleration.

Due to the vibration, respective distances between the sensing portion 27 and the lower electrode 13 and upper electrode 33, respectively, may be changed, thus capacitance therebetween may be changed.

A value of the changed capacitance is outputted to an external signal processing circuit (not shown) through the connecting electrode 31 and the electrode line 41.

Therefore, according to the manufacturing method of the MEMS sensor according to exemplary embodiments of the present disclosure, the diffusion phenomenon and the reflow phenomenon occurring during the bonding process may be prevented by forming the upper electrode 33 with polysilicon, and by bonding the first substrate 10 formed as a glass substrate and the second substrate 20 formed as the silicon substrate through the anodic bonding, and then by bonding the second substrate 20 and the third substrate 30 formed as the silicon substrate through the eutectic bonding.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A manufacturing method of a MEMS sensor, comprising:
    forming a first substrate, wherein the first substrate includes a lower electrode provided at one surface thereof;
    forming a second substrate, wherein the second substrate includes a first concave-convex portion that includes a plurality of depressions and a plurality of protrusions and is provided at one surface thereof;
    first-bonding one surface of the first substrate and one surface of the second substrate to face each other;
    forming a third substrate, wherein the third substrate includes an upper electrode provided at one surface thereof;
    second-bonding another surface of the second substrate and one surface of the third substrate to face each other; and
    forming an electrode line on another surface of the third substrate to be connected to the lower electrode and the upper electrode,
    wherein the upper electrode is made of polysilicon and is formed by ion-injecting.

2. The manufacturing method of the MEMS sensor of claim 1, wherein the first-bonding step includes anodic bonding and the second-bonding step includes eutectic bonding.

3. The manufacturing method of the MEMS sensor of claim 1, wherein the step of forming the first substrate includes:
preparing the first substrate;
forming a photoresist on the one surface of the first substrate, and then patterning the photoresist;
forming a lower electrode layer on the first substrate and an upper portion of the photoresist; and
forming the lower electrode by removing the patterned photoresist.

4. The manufacturing method of the MEMS sensor of claim 1, wherein the first substrate is a glass substrate.

5. The manufacturing method of the MEMS sensor of claim 1, wherein the step of forming the second substrate includes:
preparing the second substrate;
forming a photoresist on the one surface of the second substrate, and then patterning the photoresist;
forming the first concave-convex portion including the plurality of depressions and the plurality of protrusions by using the patterned photoresist as a mask; and
forming a low protrusion by step-etching at least one of the plurality of protrusions.

6. The manufacturing method of the MEMS sensor of claim 5, wherein the low protrusion is bonded to one side of the lower electrode of the first substrate.

7. The manufacturing method of the MEMS sensor of claim 1, further comprising after the step of first-bonding,
forming a photoresist on the other surface of the second substrate, and then pattering the photoresist;
forming a second concave-convex portion including a plurality of depressions and a plurality of protrusions by using the patterned photoresist as a mask; and
forming a sensing portion at a center of the other surface of the second substrate.

8. The manufacturing method of the MEMS sensor of claim 7, wherein the step of forming the sensing portion includes:
forming a metal layer and a photoresist on the other surface of the second substrate, and then patterning the metal layer and the photoresist; and
forming the sensing portion by etching the second substrate while using the patterned metal layer and the patterned photoresist as a mask.

9. The manufacturing method of the MEMS sensor of claim 8, wherein the metal layer is made of at least one of aluminum (Al), copper (Cu), and an alloy thereof.

10. The manufacturing method of the MEMS sensor of claim 1, wherein the step of forming the third substrate includes:
preparing the third substrate;
forming a photoresist on one surface of the third substrate, and then patterning the photoresist;
forming a connecting hole by using the patterned photoresist as a mask;
forming an insulating layer on the one surface and the other surface of the third substrate, respectively;
forming a connecting electrode inside the connecting hole;
forming an upper electrode on the one surface of the third substrate to contact the connecting electrode; and
forming a bonding layer on the upper electrode by using a metal material.

11. The manufacturing method of the MEMS sensor of claim 10, wherein the connecting electrode is made of at least one of copper (Cu) and an alloy thereof.

12. The manufacturing method of the MEMS sensor of claim 10, wherein in the step of second-bonding, the third substrate is bonded to the other surface of the second substrate through the bonding layer of the third substrate.

13. The manufacturing method of the MEMS sensor of claim 1, wherein the step of forming of the electrode line includes:
forming an electrode line layer on the other surface of the third substrate by using a metal material;
forming a photoresist on the electrode line layer, and then patterning the photoresist; and
forming the electrode line to contact the connecting electrode formed in the third substrate by etching the electrode line layer while using the patterned photoresist as a mask.

* * * * *